(12) United States Patent
Kim

(10) Patent No.: US 6,346,841 B2
(45) Date of Patent: Feb. 12, 2002

(54) PULSE GENERATOR

(75) Inventor: Kang Yong Kim, Kyoungki-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/778,772

(22) Filed: Feb. 8, 2001

Related U.S. Application Data

(63) Continuation-in-part of application No. 09/342,524, filed on Jun. 29, 1999, now Pat. No. 6,211,709.

(30) Foreign Application Priority Data

Jun. 29, 1998 (KR) .............................................. 98-24818
Dec. 29, 2000 (KR) .......................................... 2000-86310

(51) Int. Cl.[7] .............................................. H03K 3/017

(52) U.S. Cl. ...................................... 327/172; 327/175

(58) Field of Search .................................. 327/172, 173, 327/174, 175, 291, 298

(56) References Cited

U.S. PATENT DOCUMENTS 4,578,597 A * 3/1986 Soneda et al. .............. 372/172

* cited by examiner

Primary Examiner—Toan Tran
Assistant Examiner—Cassandra Cox
(74) Attorney, Agent, or Firm—Jacobson Holman, PLLC

(57) ABSTRACT

A pulse generator, which only occupies a small area in a circuit chip by using a characteristic that the potential in both ends of a capacitor is maintained. The pulse generator comprises a voltage level control unit for controlling a voltage level of a first node according to the state of input signal; a first switching unit for controlling a voltage level of a second node by performing a switching operation according to the state of the input signal; a second switching unit for changing a voltage level of the second node by performing another switching operation, opposite to the first switching means according to the state of the input signal; a charge/discharge unit for charging/discharging a voltage between the first and the second nodes according to the switching state of the first and the second switching means; and an output unit for outputting a pulse signal according to the charging/discharging state of the charge/discharge means.

16 Claims, 15 Drawing Sheets

PULSE GENERATOR

This is a continuation-in-part of U.S. application Ser. No. 09/342,524, filed: Jun. 29, 1999 now U.S. Pat. No. 6,211,709.

BACKGROUND OF THE INVENTION

1. Field of the Invention

The present invention relates to a pulse generator, in particular to a pulse generator for generating a pulse signal, which, as a circuit element, only occupies a small area by making use of a characteristic that the potential in both ends of a capacitor is maintained.

2. Description of the Background Art

In general, a Synchronous Dynamic Random Access Memory (SDRAM) is a memory device for controlling input/output of data synchronized with a clock (CLK) signal, in which internal pulse signals are generated regularly, thereby controlling input/output of data according to the CLK signal.

FIG. 1 is a view illustrating a conventional pulse generator.

Referring to FIG. 1, the pulse generator comprises a delay unit 1 for receiving an input signal Sin, delaying it by a certain time interval and then outputting the delayed signal as a delay signal D, and a NAND gate 2 for receiving the input signal Sin and the delay signal D applied from the delay unit 1. The NAND gate performs a NAND operation and then outputs a pulse signal Sout.

The delay unit 1 of FIG. 1 can be constructed as shown in FIGS. 2a or 2b.

The delay unit 1, as shown in FIG. 2a, can be made by serially connecting an odd number of inverters IVO in order to delay the input signal Sin. The delay unit 1, as shown in FIG. 2a, may also be made by serially connecting an odd number of inverters IVO through the medium of a resistor R1 in order to delay the input signal Sin.

As shown in FIG. 3, a conventional pulse generator having the above-mentioned construction outputs a pulse signal Sout that is synchronized with a low level when the input signal Sin transitions from low to high.

FIG. 1 shows an example of generation of a pulse being synchronized with a rising time of the input signal Sin. Unlike this, a circuit for generating a pulse being synchronized with a falling time of the input signal Sin is disclosed in FIG. 4.

Referring to FIG. 4, the pulse generator comprises a delay unit 3 for receiving an input signal Sin, delaying it by a certain time interval and then outputting the delayed signal as a delay signal D, and an NOR gate 4 for receiving the input signal Sin and the delay signal D applied from the delay unit 1. The NOR gate performs a NOR operation and then outputting a pulse signal Sout.

As shown in FIG. 5, the conventional pulse generator having a construction as shown in FIG. 4, outputs a pulse signal Sout that is synchronized with a high level when the input signal Sin transitions from high to low.

According to the conventional pulse generator shown in FIGS. 1 and 4, the delay unit 1 has at least six or more transistors for constructing an odd number of inverters IVO. Also, the NAND gate 2 or NOR gate 4 consists of at least 2 transistors. Furthermore, the delay unit 1 has a plurality of capacitors or resistors for lengthening the delay time of the input signal Sin.

As a result, the conventional pulse generator has at least eight transistors and a plurality of capacitors or resistors. In general, the total number of the elements used for constructing the pulse generator sums between 14 and 18.

However, the conventional pulse generator as mentioned above has a disadvantage of occupying a large area when constructing a semiconductor memory device, because the pulse generator consists of many elements.

SUMMARY OF THE INVENTION

Accordingly, it is an object of the present invention to provide a pulse generator which generates a pulse signal by making use of a characteristic of a capacitor that a potential at both ends of the capacitor is maintained, thereby implementing a pulse generator in a small area.

In order to achieve the above-described object and one aspect of the present invention, a pulse generator comprises: a voltage level control means for controlling a voltage level of a first node according to the state of an input signal; a first switching means for controlling a voltage level of a second node, which is switched in accordance with the state of the input signal; a second switching means for changing the voltage level of the second node which is switched opposite to the first switching means according to the state of the input signal; a charge/discharge means for charging/discharging a voltage between the first node and the second node according to a switching state of the first and the second switching means; and an output means for outputting a pulse signal according to the charging/discharging state of the charge/discharge means.

BRIEF DESCRIPTION OF THE DRAWINGS

The present invention will become better understood with reference to the accompanying drawings, which are given only by way of illustration and thus do not limit the present invention, wherein.

DETAILED DESCRIPTION OF THE PREFERRED EMBODIMENTS

A pulse generator in accordance with preferred embodiments of the present invention will now be described with reference to the accompanying drawings.

The present invention generates a pulse signal by using a characteristic that a potential of both ends of a capacitor is maintained and by selectively controlling the switching unit according to the state of an input signal. That is, changing a voltage level of both ends of the capacitor generates the pulse signal.

Figure 1:
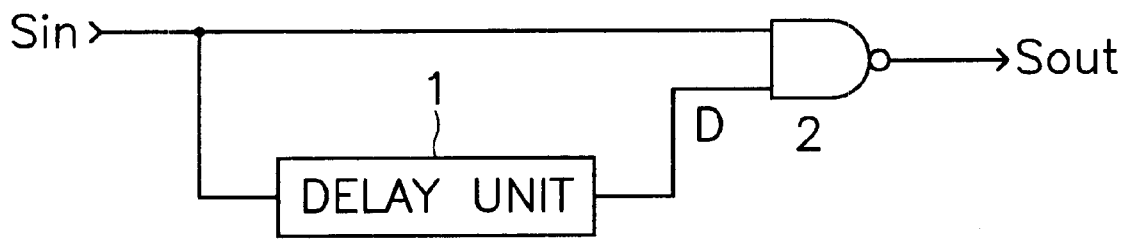
FIG. 1 is a circuit diagram illustrating a pulse generator in accordance with conventional art.
Figure 2A:
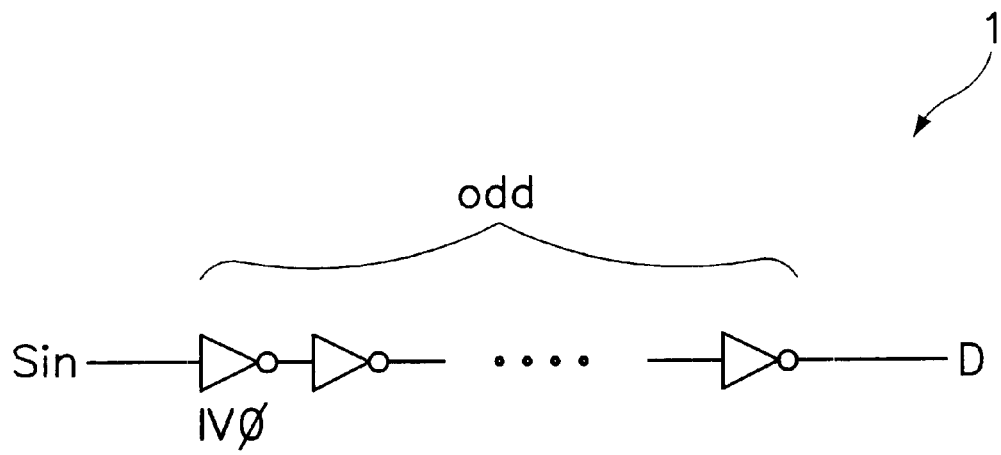
FIG. 2a is a detailed circuit diagram illustrating an example of a delay unit of FIG. 1.
Figure 2B:
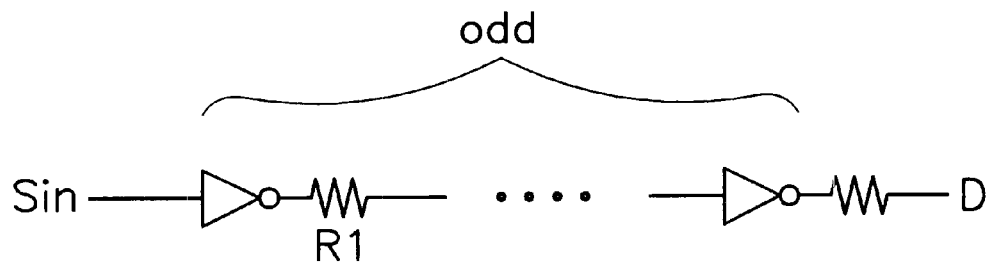
FIG. 2b is a detailed circuit diagram illustrating another example of a delay unit of FIG. 1.
Figure 3:
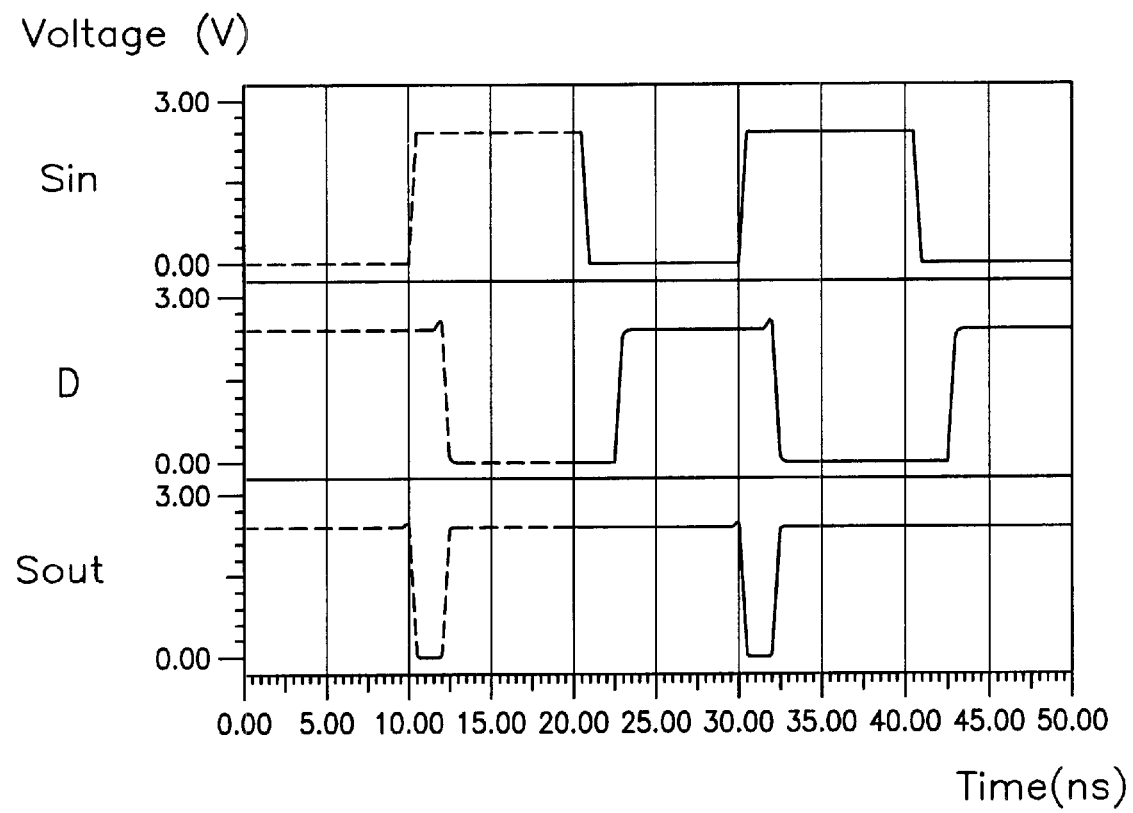
FIG. 3 is a timing chart for the pulse generator of FIG. 1.
Figure 4:
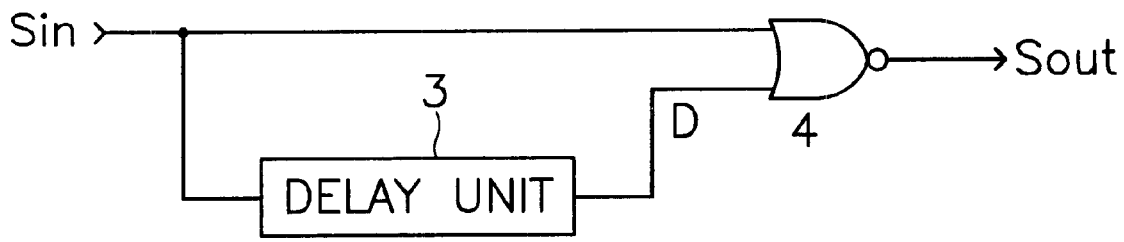
FIG. 4 is a circuit diagram illustrating another pulse generator in accordance with conventional art.
Figure 5:
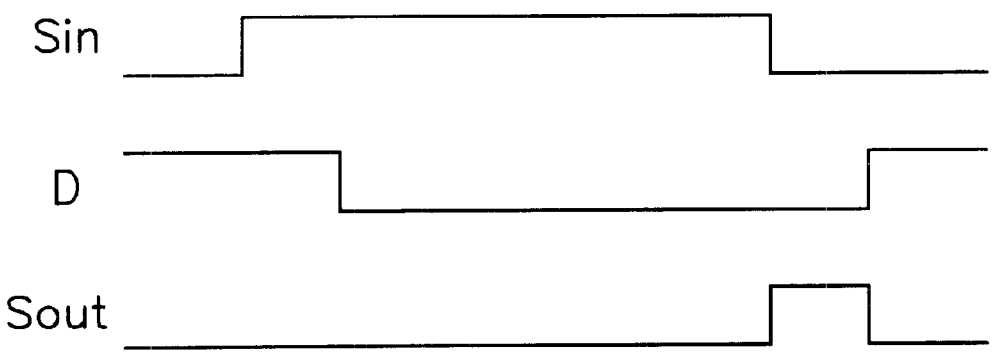
FIG. 5 is a timing chart for the pulse generator of FIG. 4.
Figure 6:
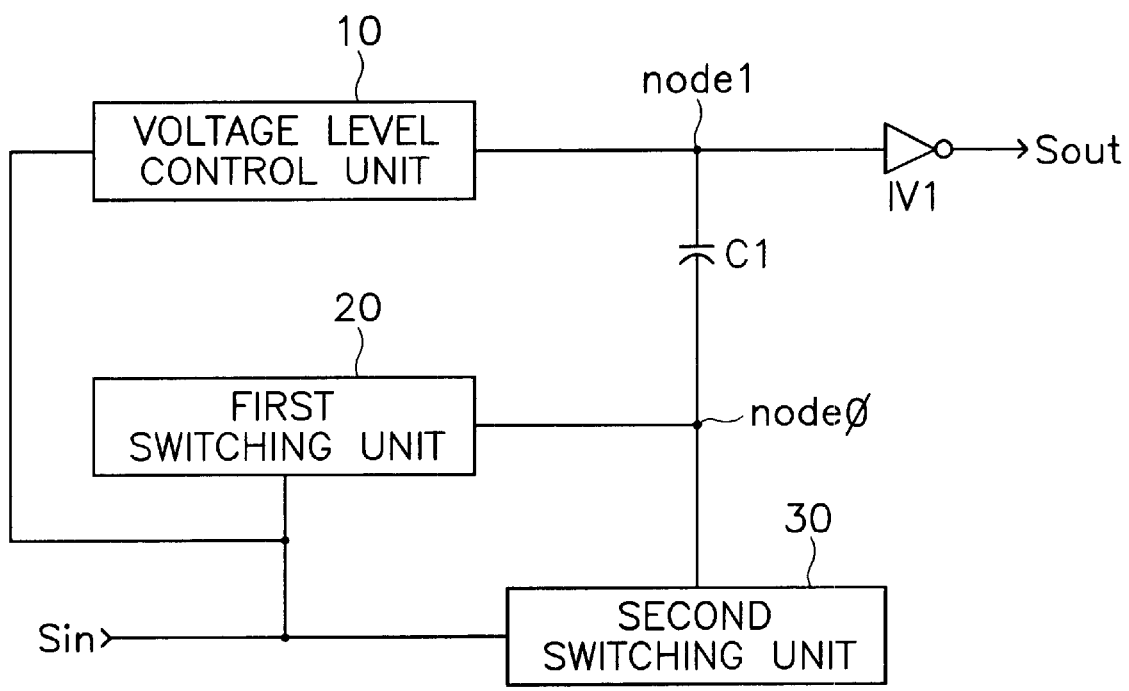
FIG. 6 is a circuit diagram illustrating the first preferred embodiment of a pulse generator in accordance with the present invention.

FIG. 6 is a circuit diagram illustrating the first preferred embodiment of a pulse generator in accordance with the present invention.

Referring to FIG. 6, the present invention comprises a voltage level control unit 10 for controlling a voltage level of a node 1 according to the state of input signal Sin, a first switching unit 20 for controlling a voltage level of a node 0 by performing a turn-on/turn-off switching operation according to the state of input signal Sin, EL second switching unit 30 for changing the voltage level of node 0 by performing another switching operation opposite to the first switching unit 20 according to the state of input signal Sin, a capacitor C1, which is connected between node 1 and node 0, for performing charging/discharging operation according to a potential difference occurring at both ends of node 0 and node 1, and an inverter IV1 for inverting the charge/discharge voltage of the capacitor C1 and outputting a pulse signal Sout.

Figure 7:
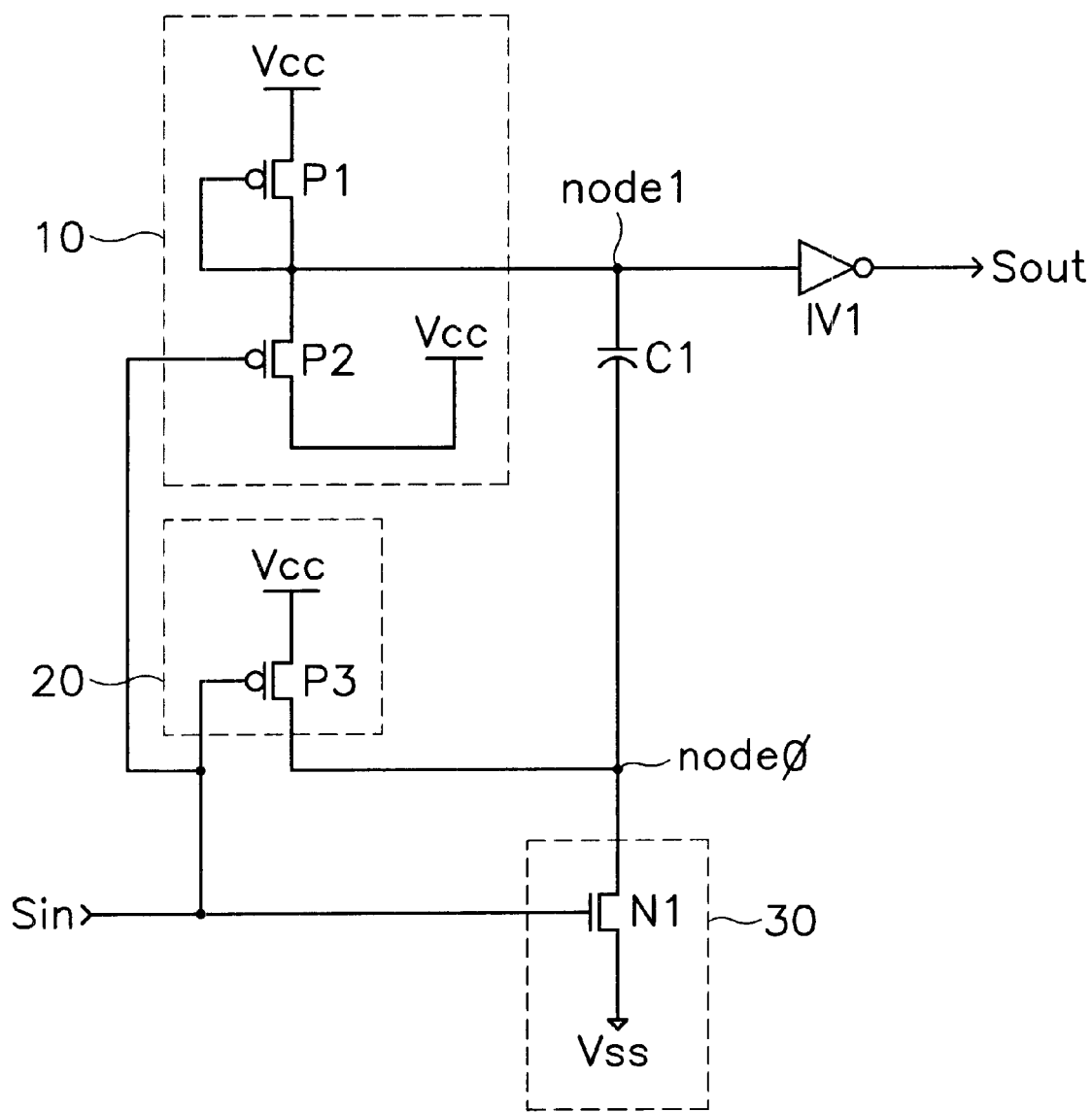
FIG. 7 is a detailed circuit diagram of the pulse generator of FIG. 6.

FIG. 7 is a detailed circuit diagram of FIG. 6.

Referring to FIG. 7, the voltage level control unit 10 comprises a PMOS transistor P2 for receiving an input signal Sin through its gate terminal, the source terminal of which is connected to a power voltage terminal Vcc, and a PMOS transistor P1 receiving a power voltage Vcc through its source terminal, the drain terminal of which is connected to node 1 in common with the drain terminal of the PMOS transistor P2, and the gate terminal of PMOS transistor P1 is connected to node 1 together with the common drain terminals.

Here, the PMOS transistor P2 is for switching the voltage being applied to the node 1 and the PMOS transistor P1 is for maintaining a voltage at node 1.

The first switching unit 20 comprises a PMOS transistor P3 for receiving an input signal Sin through its gate terminal, the source terminal of which is connected to the power voltage terminal Vcc and the drain terminal of which is connected to node 0.

The second switching unit 30 comprises an NMOS transistor N1, which is connected between node 0 and a ground voltage terminal Vss, for receiving an input signal Sin through its gate terminal.

A capacitor C1 is constructed between node 1 and the common drain terminal of PMOS transistors P1 and P2, and node 0 as the common drain terminal of the PMOS transistor P3 and NMOS transistor N1. The charge/discharge voltage of the capacitor C1 is outputted as a pulse signal Sout through the inverter IV1 connected to node 1.

Here, a resistor (not shown) may be connected respectively between the source terminal of the PMOS transistor P1 and the power voltage terminal Vcc, between the drain terminal of the PMOS transistor P1 and node 1, or between the gate terminal of the PMOS transistor P1 and node 1.

Figure 8:
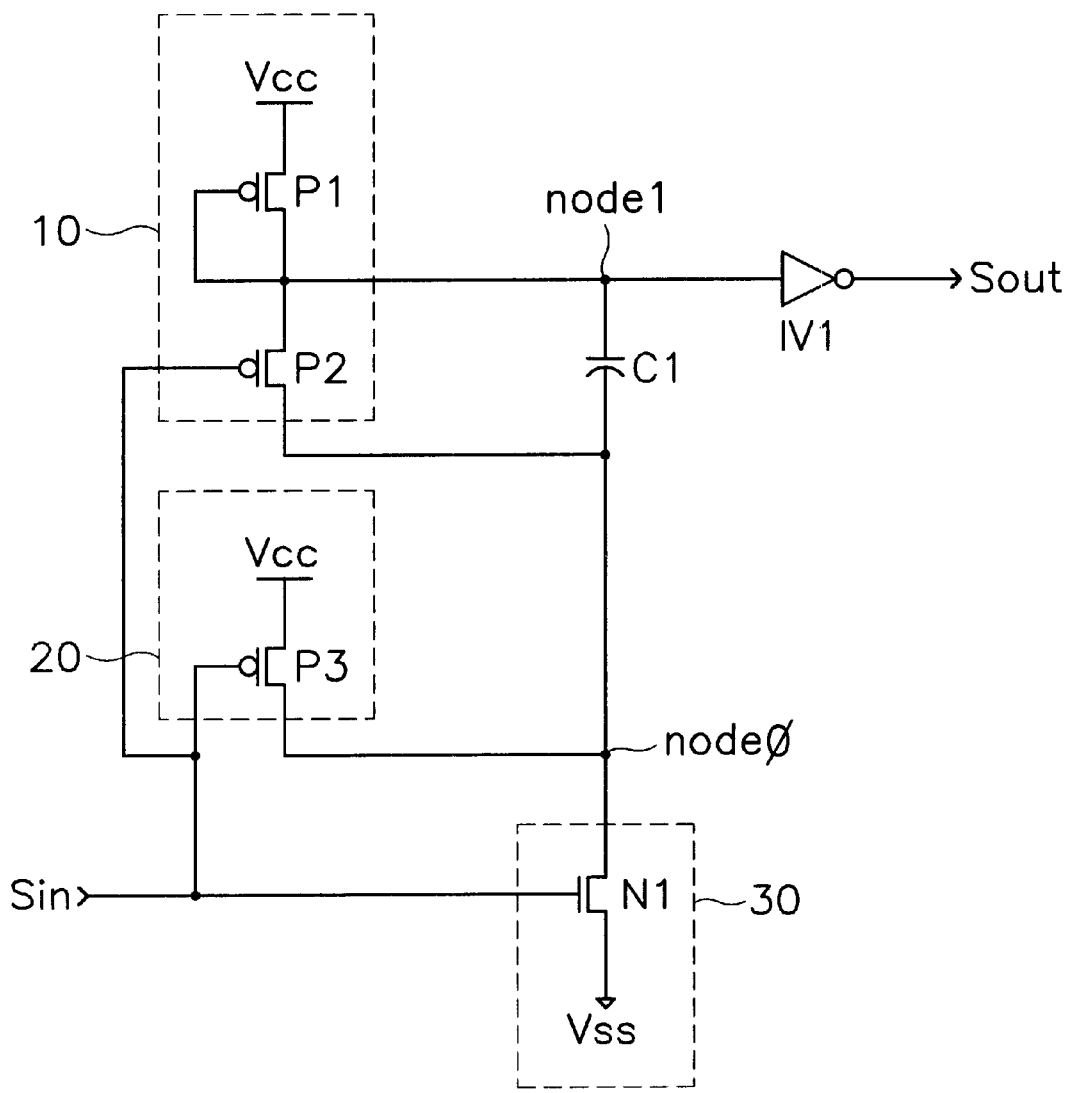
FIG. 8 is a detailed circuit illustrating a modified embodiment of the first embodiment in accordance with the present invention.

In the pulse generator of FIG. 7, the source terminal of PMOS transistor P2 of the voltage level control unit 10 may be connected to an end of the capacitor C1 and node 0 as shown in FIG. 8.

Referring to FIG. 8, a resistor (not shown) may be connected respectively between the source terminal of the PMOS transistor P1 and the power voltage terminal Vcc, between the drain terminal of the PMOS transistor P1 and node 1, or between the gate terminal of the PMOS transistor P1 and node 1.

Hereinafter, operations of the embodiments of FIGS. 7 and 8 having the above-mentioned construction will be described with reference to the timing chart of FIG. 9.

As shown in FIGS. 7 and 8, the pulse generator outputs a pulse signal Sout that is synchronized with a high level when the input signal Sin transitions from low to high.

At an initial state, when the input signal Sin is low, the NMOS transistor N1 is turned off and the PMOS transistors P1,P2 and P3 are turned on and therefore, node 0 and node 1 become high by applying the power voltage Vcc.

Here, when the input signal Sin transitions from low to high, the PMOS transistors P2 and P3 are turned off and the NMOS transistor N1 is turned on and therefore, node 0 transitions from high and low.

At this time, the capacitor C1 is in a charged state by the voltage of node 1.

Accordingly, node 1 becomes low, like node 0, by field the effect generated at both ends of the capacitor C1, and the signal disabled to low by the inverter IV1 is inverted. AS a result, a high signal is outputted as a pulse signal Sout.

Here, since the capacitor C1 connected to node 1 by the PMOS transistor P1 has been charged high, the signal charged by the capacitor C1 is inputted to the inverter IV1 as a high signal and inverted at the threshold voltage of the inverter IV1 and therefore a low pulse is outputted as a pulse signal Sout.

Lastly, when the input signal Sin transitions again to low, all operations return to the initial condition.

Figure 9:
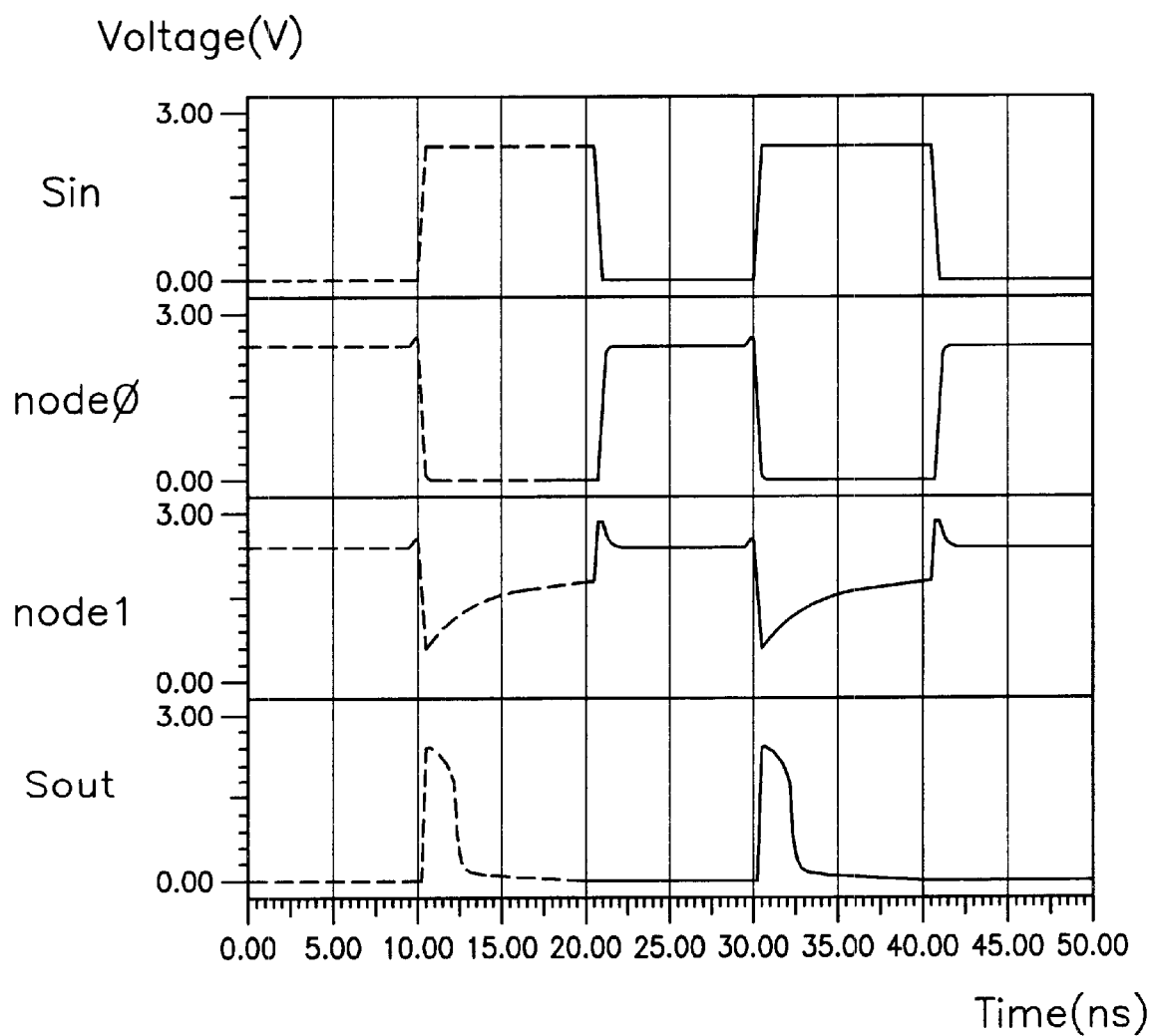
FIG. 9 is a timing chart of the embodiments of FIGS. 7 and 8.

The voltage waveform of the input signal Sin and pulse signal Sout is illustrated in FIG. 9.

Referring to FIG. 9, the pulse width is 2nsec.

In the present invention, the main factors affecting the pulse width of the pulse signal Sout are the size of the transistor of the second switching unit 30, the capacitance of the capacitor, the size of PMOS transistor of the voltage level control unit 10 and the threshold voltage of the inverter.

Accordingly, in the present invention, it is possible to change the pulse width of the pulse signal Sout by controlling these sizes.

Figure 10:
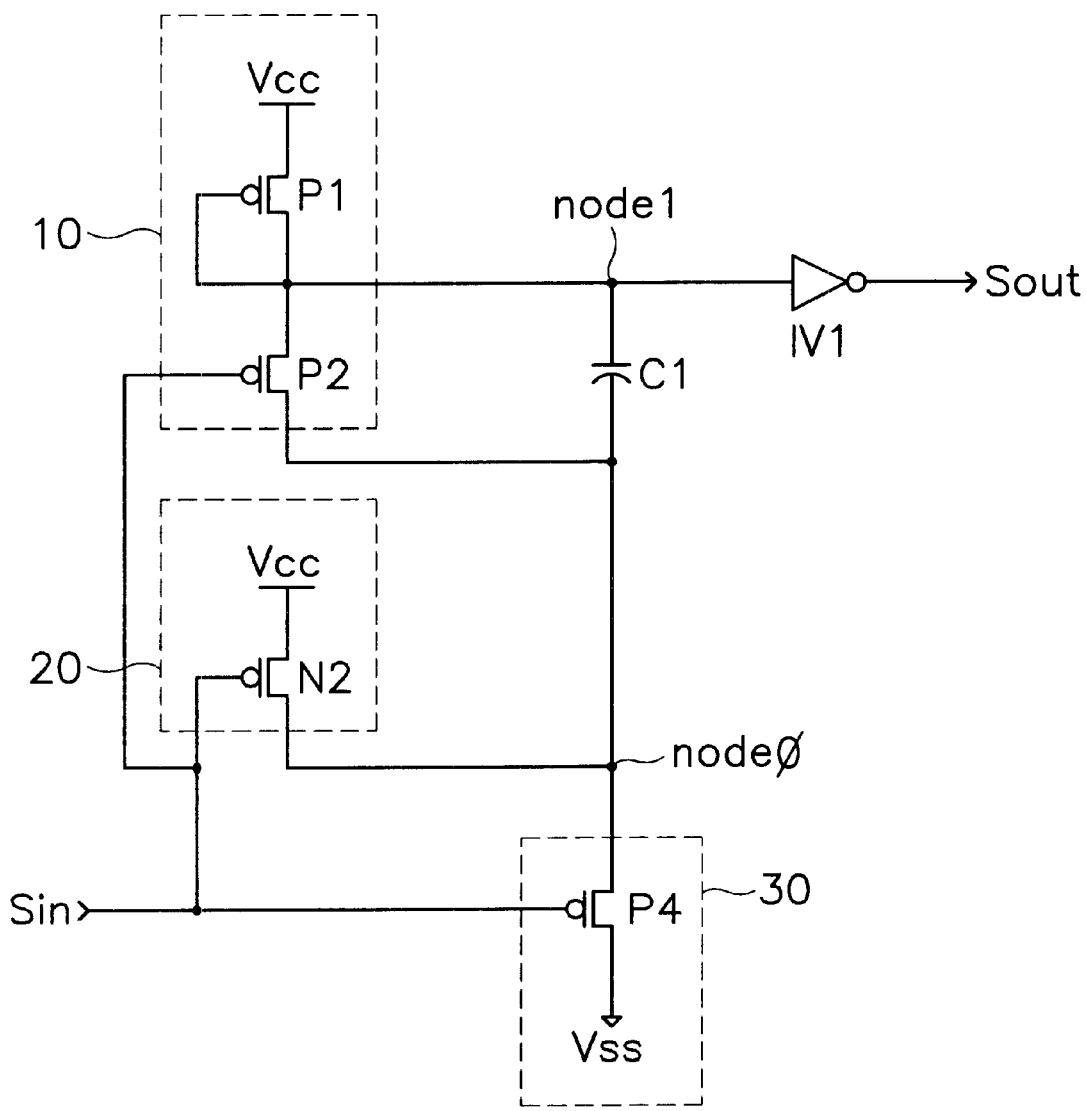
FIGS. 10 to 13 are detailed circuits illustrating other modified embodiments of the first embodiment in accordance with the present invention.

FIG. 10 is a circuit diagram of the pulse generator illustrating another modified embodiment of the first embodiment in accordance with the present invention.

Referring to FIG. 10, the first switching unit 20 of the present invention comprises an NMOS transistor N2 for receiving an input signal Sin through the transistor's gate terminal, where the drain terminal thereof is connected to the power voltage terminal Vcc and the source terminal thereof is connected to node 0.

The second switching unit 30 comprises a PMOS transistor P4, which is connected between node 0, an end of the capacitor C1, and the ground voltage terminal Vss, for receiving an input signal Sin through its gate terminal.

Figure 11:
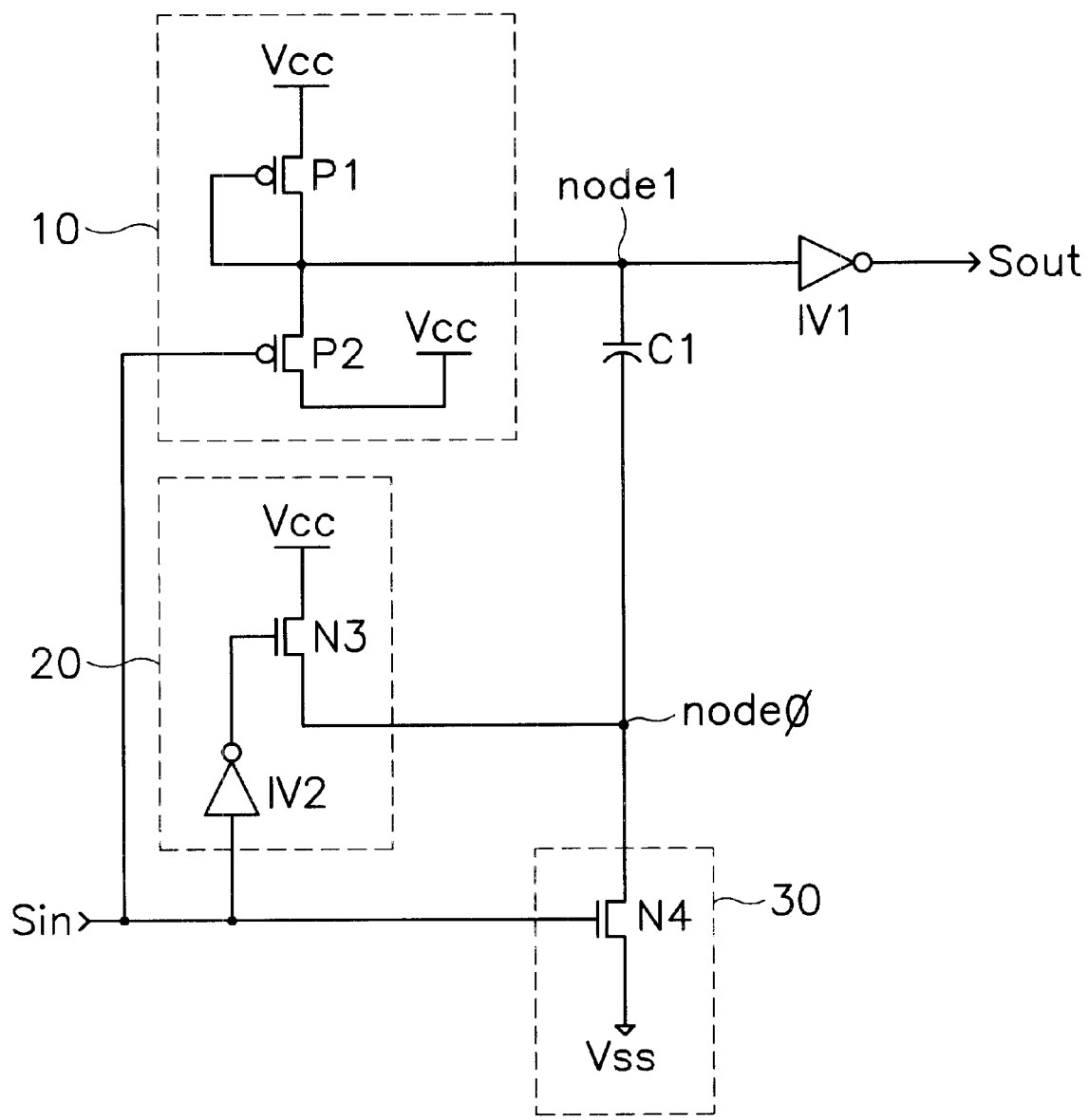

FIG. 11 is another modified embodiment of the pulse generator in accordance with the present invention.

Referring to FIG. 11, the first switching unit 20 of the present invention comprises an inverter IV2 for inverting an input signal Sin, and an NMOS transistor N3 for receiving the input signal Sin inverted by the inverter IV2 through its gate terminal, where the drain terminal thereof is connected to the power voltage terminal Vcc and the source terminal thereof is connected to node 0.

The second switching unit 30 comprises an NMOS transistor N4, which is connected between node 0, an end of the capacitor C1, and the ground voltage terminal Vss, for receiving an input signal Sin through its gate terminal.

Figure 12:
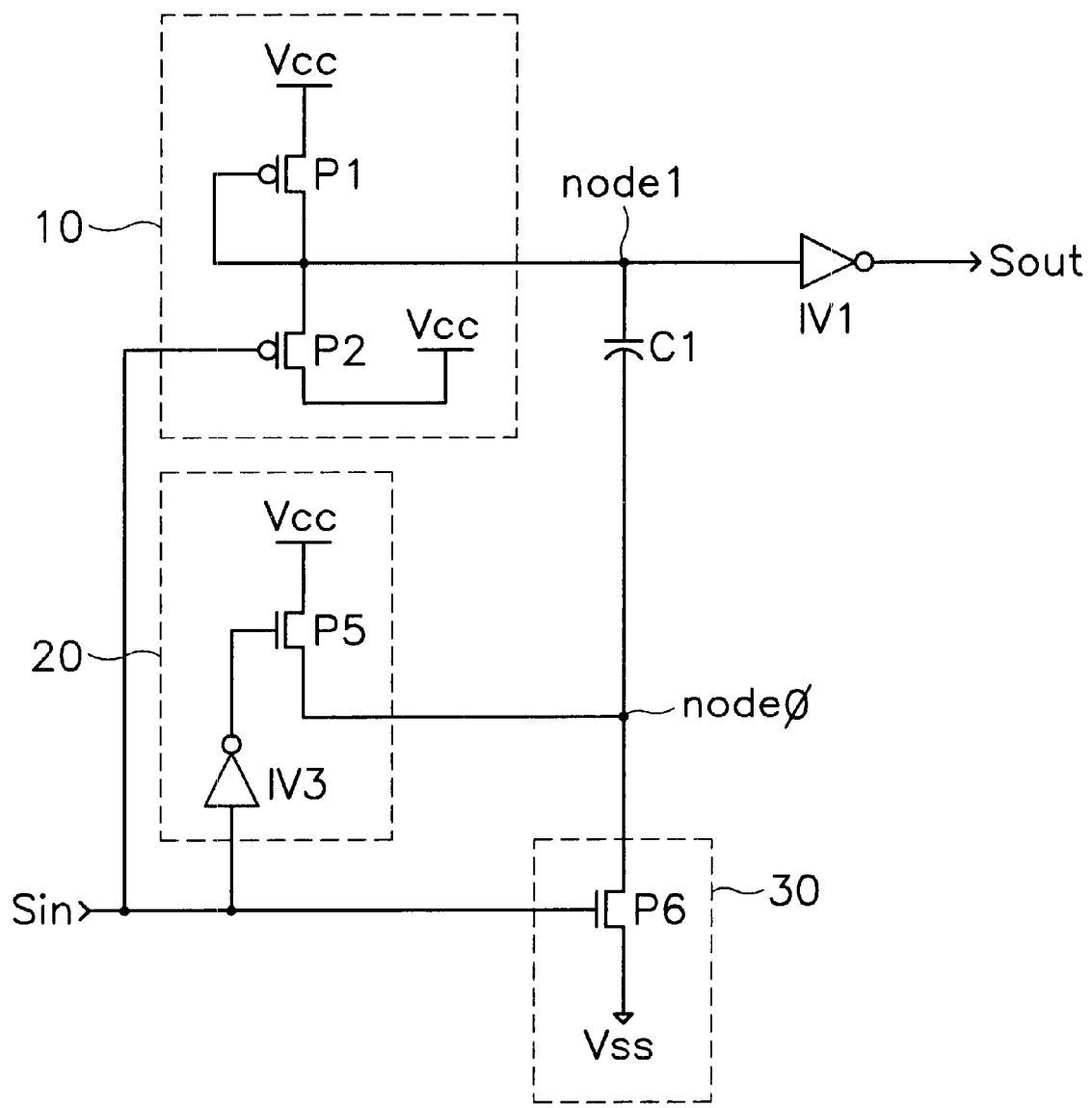

FIG. 12 is another modified embodiment of the pulse generator in accordance with the present invention.

Referring to FIG. 12, the first switching unit 20 of the present invention comprises an inverter IV3 for inverting an input signal Sin, and a PMOS transistor P5 for receiving the input signal Sin inverted by the inverter IV3 through its gate terminal, where the source terminal thereof is connected to the power voltage terminal Vcc and the drain terminal thereof is connected to node 0.

The second switching unit 30 comprises a PMOS transistor P6, which is connected between node 0, an end of the capacitor C1 and the ground voltage terminal Vss, for receiving an input signal Sin through its gate terminal.

Figure 13:
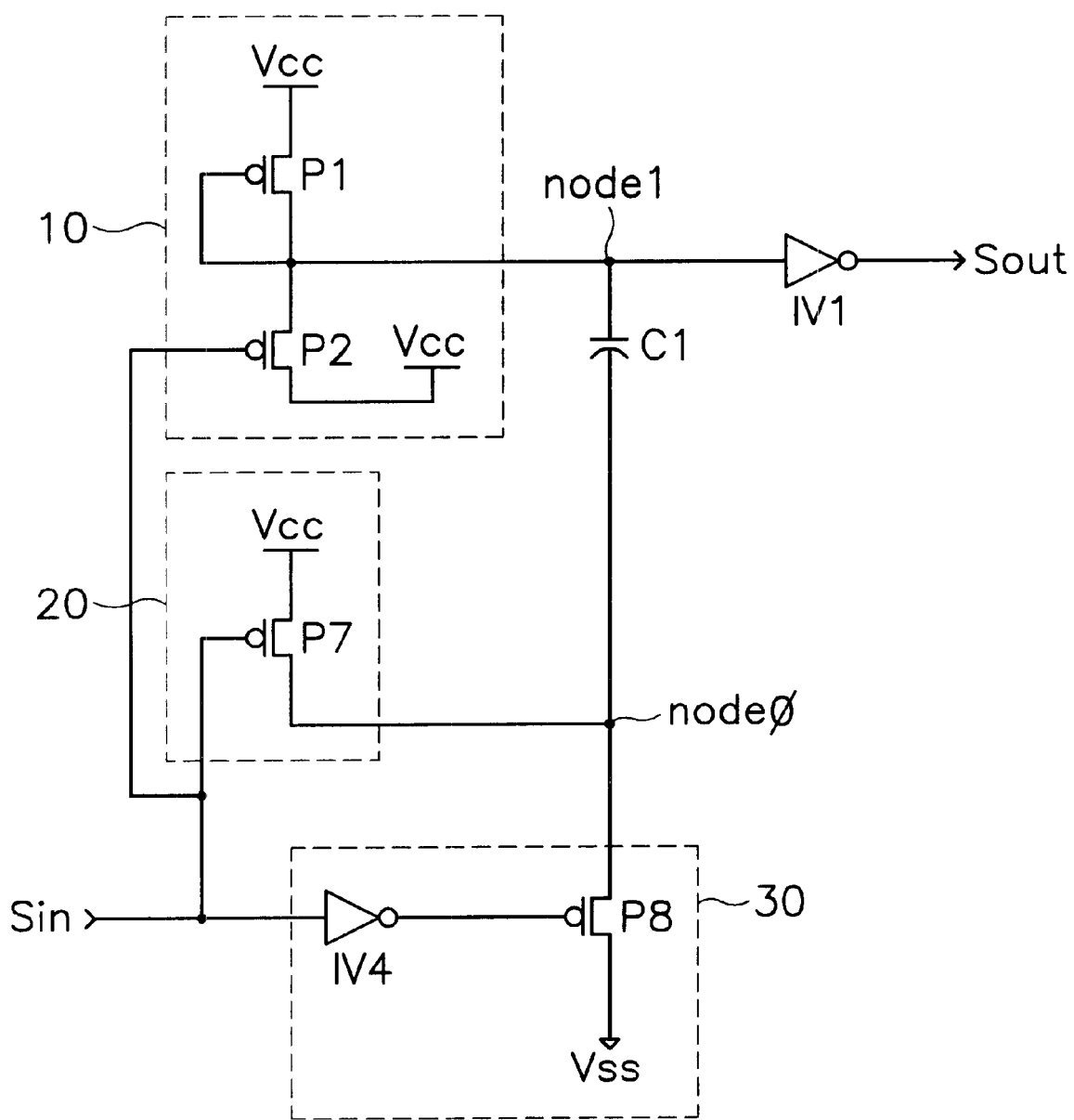

FIG. 13 is another modified embodiment of the pulse generator in accordance with the present invention.

Referring to FIG. 13, the first switching unit 20 of the present invention comprises a PMOS transistor P7 for receiving the input signal Sin through its gate terminal, where the source terminal thereof is connected to the power voltage terminal Vcc and the drain terminal thereof is connected to node 0.

The second switching unit 30 comprises an inverter IV4 for inverting an input signal Sin, and a PMOS transistor P8, which is connected between the capacitor C1 and the ground voltage terminal Vss, for receiving the input signal Sin inverted by the inverter IV4 through its gate terminal.

As mentioned above, the operation of the embodiments of FIGS. 10 to 13 is the same as that of FIGS. 7 and 8. Also a pulse signal Sout is outputted as shown in FIG. 9.

Figure 14:
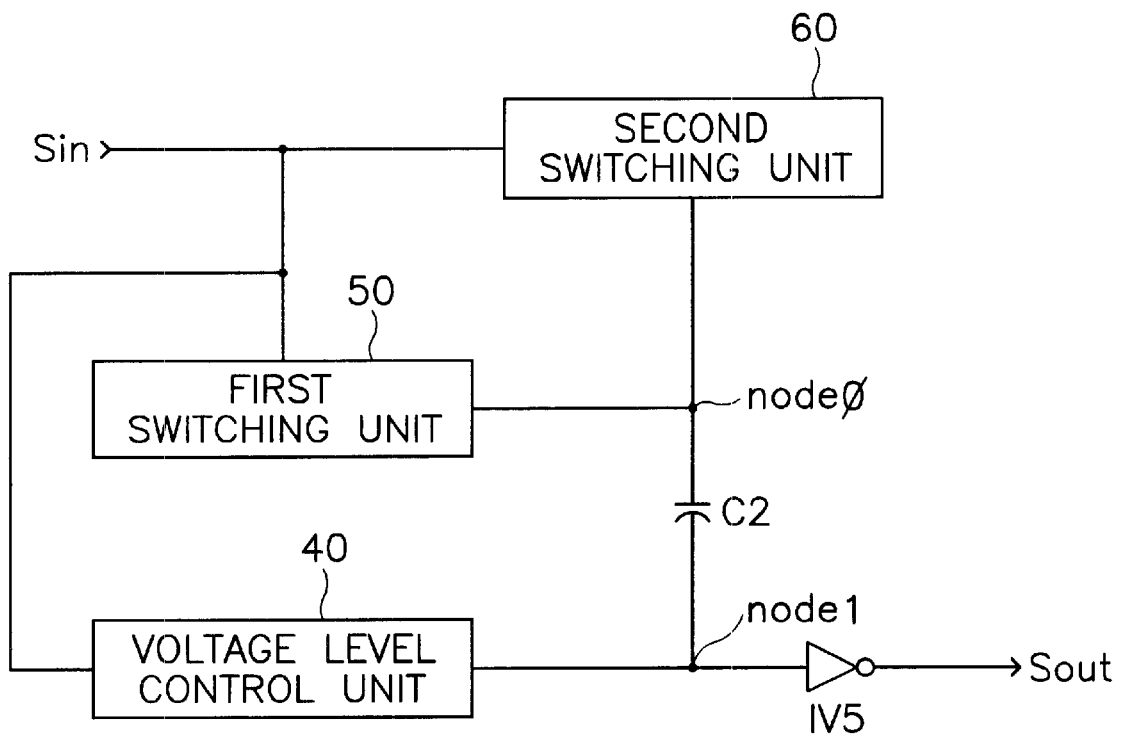
FIG. 14 is a circuit diagram illustrating the second embodiment of a pulse generator in accordance with the present invention.

FIG. 14 is a circuit diagram illustrating the second embodiment of a pulse generator in accordance with the present invention. Referring to FIG. 14, when the input signal Sin transitions from high to low, the pulse signal Sout synchronized with a high level is outputted, which is opposite to that of the pulse generator of FIG. 6.

Referring again to FIG. 14, the present invention comprises a voltage level control unit 40, connected between the input terminal and the ground voltage terminal Vss, for controlling a voltage level of node 1 according to the state of input signal Sin, a first switching unit 50 for controlling a voltage level of node 0 by performing the turn-on/turn-off switching operation according to the state of the input signal Sin, a second switching unit 60 for changing the voltage level of node 0 by performing another switching operation opposite to the first switching unit 50 according to the state of input signal, a capacitor C2 for performing charging/discharging operation of the voltage between node 1 and node 0 according to switching states of the first and the second switching units 50 and 60, and an inverter IV5 for inverting the output voltage being applied from the capacitor C2 and outputting a pulse signal Sout.

Figure 15:
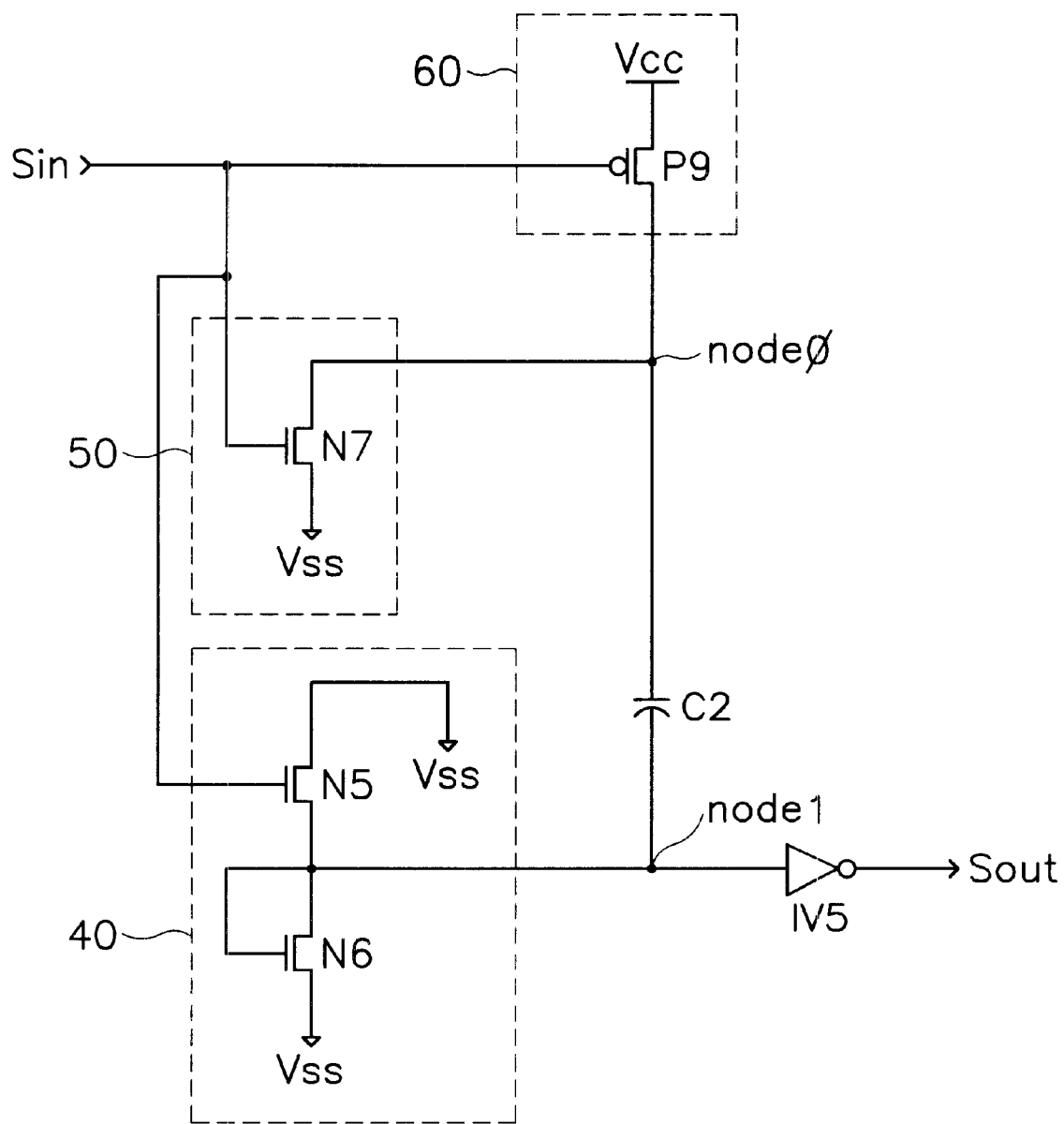
FIG. 15 is a detailed circuit diagram of the pulse generator of FIG. 14.

FIG. 15 is a detailed circuit diagram of the pulse generator of FIG. 14.

Referring to FIG. 15, the voltage level control unit 40 comprises an NMOS transistor N5, the source terminal of which is connected to a ground voltage terminal Vss, for receiving an input signal Sin through its gate terminal, and an NMOS transistor N6, where the drain terminal thereof is commonly connected to the NMOS transistor N5, the gate terminal is connected to the common drain terminal and is further connected to node 1, and the source terminal is connected to the ground voltage terminal Vss.

The first switching unit 50 comprises an NMOS transistor N7 for receiving the input signal Sin through its gate terminal, where the source terminal thereof is connected to the ground voltage terminal Vss and the drain terminal is connected to an end of the capacitor C2 through node 0.

The second switching unit 60 comprises a PMOS transistor P9, which is connected between the power voltage terminal Vcc and node 0 of an end of the capacitor C2, for receiving the input signal Sin through its gate terminal.

The capacitor C2 is connected between node 1 as a common drain terminal of the NMOS transistors N5 and N6 and node 0 as a common drain terminal of the PMOS transistor P9 and the NMOS transistor N7, and an inverter IV5 is connected to the output terminal of the capacitor C2 and node 1.

Figure 16:
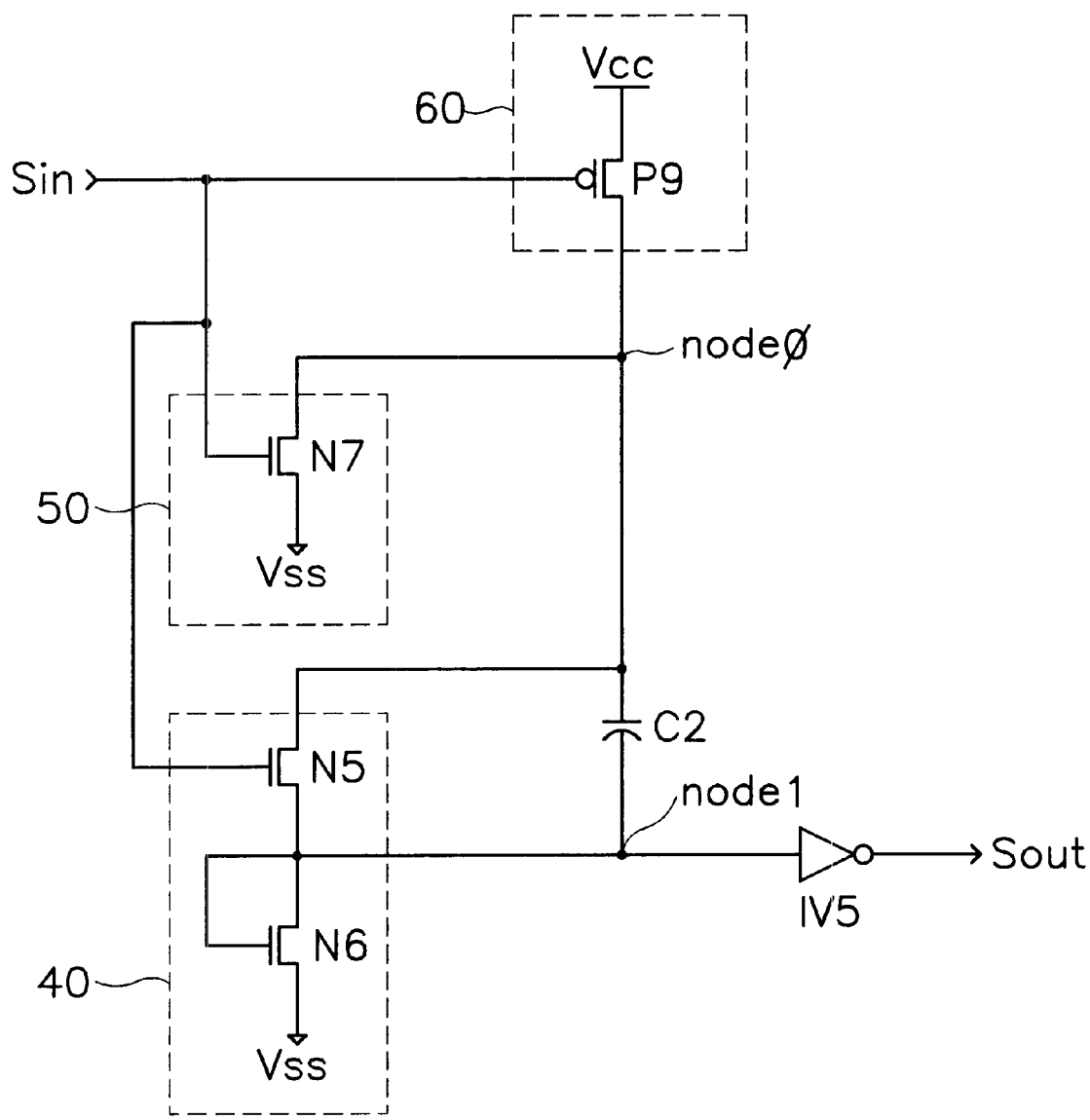
FIG. 16 is a detailed circuit diagram illustrating a modified embodiment of the second embodiment in accordance with the present invention.

As shown in FIG. 16, the source terminal of the NMOS transistor N5 of the voltage level control unit 40, as mentioned above, may be connected to an end of the capacitor C2.

Here, a resistor (not shown) may be connected respectively between the source terminal of the NMOS transistor N6 and the ground voltage terminal Vss, between the drain terminal of the NMOS transistor N6 and node 1 or between the gate terminal of the NMOS transistor N6 and node 1.

Hereinafter, the operations of the pulse generators of FIGS. 15 and 16 as above-constructed will be described as follows.

At an initial state, when the input signal Sin is high, the PMOS transistor P9 is turned off and the NMOS transistors N5,N6 and N7 are turned on and therefore, node 0 and node 1 become high by connecting to the ground voltage terminal Vss. Here, when the input signal Sin transitions from high to low, the NMOS transistors N5 and N7 are turned off and the PMOS transistor P9 is turned on and therefore, node 0 transitions from high and low.

Accordingly, node 1 goes low, like node 0, by field the effect generated at both ends of the capacitor C2, the low signal is inverted by the inverter IV5 and then a high signal is outputted as a pulse signal Sout.

Node 1 goes high by the NMOS transistor N6 and then the capacitor C2 is charged, the high signal charged in the capacitor C2 is inputted to the inverter IV5 and then inverted at the threshold voltage of the inverter IV5 and therefore a low pulse is outputted as a pulse signal Sout.

As a result, in the embodiments of the present invention, the number of the elements being used totals to seven including six transistors and one capacitor.

Accordingly, using elements fewer than those of the conventional pulse generating circuit can still generate the pulse signal.

On the other hand, although the capacitor used in the present invention is an MOS capacitor, it is possible to use all capacitors including those used in DRAM cells, etc. In particular, using a capacitor for DRAM cell is very effective, since it allows large capacitance in a small area.

As described above, the pulse generator of the present invention effectively generates a pulse through a pulse generator occupying a small area.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A pulse generator comprising:
    means for receiving an input signal;
    a first node;
    a second node;
    a voltage level control means for controlling a voltage level of the first node according to a state of the input signal;
    a first switching means for controlling a voltage level of the second node by performing a switching operation according to the state of the input signal;
    a second switching means for changing a voltage level of the second node by performing another switching operation, opposite to the first switching means according to the state of the input signal;
    a charge/discharge means for charging/discharging a voltage between the first and the second nodes according to a switching state of the first and the second switching means; and
    an output means for outputting a pulse signal according to the charging/discharging state of the charge/discharge means.

2. The pulse generator according to claim 1, wherein the voltage level control means comprises:
    a first pull-up unit for receiving the input signal through its gate terminal and the power voltage through its source terminal; and
    a second pull-up unit of receiving the power voltage through its source terminal, wherein the drain terminal thereof is commonly connected to that of the first pull-up unit and the gate terminal thereof is connected to the common drain terminal and is further connected to the first node.

3. The pulse generator according to claim 1, wherein the voltage level control means comprises:
    a first pull-up unit for receiving the input signal through its gate terminal, wherein the source terminal thereof is connected to an end of the charge/discharge means; and
    a second pull-up unit of receiving the power voltage through its source terminal, wherein the drain terminal thereof is commonly connected to that of the first pull-up unit and, the gate terminal thereof is connected to the common drain terminal and is further connected to the first node.

4. The pulse generator according to claim 1, wherein the first switching means comprises:
    a pull-up unit for receiving the input signal through its gate terminal wherein the source terminal thereof is connected to the power voltage terminal and the drain terminal thereof is connected to an end of the charge/discharge means through the second node.

5. The pulse generator according to claim 4, wherein the second switching means comprises:
    a pull-down unit, which is connected between an end of the charge/discharge means and the ground voltage terminal, for receiving the input signal through its gate terminal.

6. The pulse generator according to claim 4, wherein the second switching means comprises:
    an inverter for inverting the input signal; and
    a pull-up unit, which is connected between the charge/discharge means and the ground voltage terminal, for receiving the input signal inverted from the inverter through its gate terminal.

7. The pulse generator according to claim 1, wherein the first switching means comprises:
    a pull-down unit of receiving the input signal through its gate terminal, wherein the drain terminal thereof is connected to the power voltage terminal and the source terminal thereof is connected to an end of the charge/discharge means through the second node.

8. The pulse generator according to claim 7, wherein the second switching means comprises:
    a pull-up unit, which is connected between the charge/discharge means and the ground voltage terminal, for receiving the input signal through its gate terminal.

9. The pulse generator according to claim 1, wherein the first switching means comprises:
    an inverter for inverting the input signal ; and
    a pull-down unit of receiving the input signal inverted from the inverter through its gate terminal, wherein the drain terminal thereof is connected to the ground voltage terminal and the source terminal thereof is connected to an end of the charge/discharge means through the second node.

10. The pulse generator according to claim 9, wherein the second switching means comprises:
    a pull-down unit, which is connected between the charge/discharge means and the ground voltage terminal, for receiving the input signal through its gate terminal.

11. The pulse generator according to claim 1, wherein the first switching means comprises:
    an inverter for inverting the input signal ; and
    a pull-up unit of receiving the input signal inverted from the inverter through its gate terminal, wherein the source terminal thereof is connected to the power voltage terminal and the drain terminal thereof is connected to an end of the charge/discharge means through the second node.

12. The pulse generator according to claim 11, wherein the second switching means comprises:
    a pull-up unit, which is connected between the charge/discharge means and the ground voltage terminal, for receiving the input signal through its gate terminal.

13. The pulse generator according to claim 1, wherein the charge/discharge means is a capacitor.

14. The pulse generator according to claim 1, wherein the output means is an inverter for inverting the voltage of the first node.

15. The pulse generator according to claim 1, wherein the voltage level control means comprises:

a first pull-down unit for receiving the input signal through its gate terminal, wherein the source terminal thereof is connected to the ground voltage terminal; and a second pull-down unit, the drain terminal of which is commonly connected to that of the first pull-down unit, the gate terminal of which is connected to the common drain terminal and is further connected to the first node, and the source terminal of which is connected to the ground voltage terminal.

16. The pulse generator according to claim 1, wherein the voltage level control means comprises:

a first pull-down unit of receiving the input signal through its gate terminal, wherein the source terminal thereof is connected to an end of the charge/discharge means; and a second pull-down unit, the drain terminal of which is commonly connected to that of the first pull-down unit, the gate terminal of which is connected to the common drain terminal and is further connected to the first node, and the source terminal of which is connected to the ground voltage terminal.

\* \* \* \* \*